United States Patent [19]

Wojcik

[11] Patent Number: 4,668,607

[45] Date of Patent: May 26, 1987

[54] MULTILEVEL IMAGING OF PHOTOPOLYMER RELIEF LAYER FOR THE PREPARATION OF CASTING MOLDS

[75] Inventor: Michael S. Wojcik, Hockessin, Del.

[73] Assignee: E. I. Du Pont de Nemours and Company, Wilmington, Del.

[21] Appl. No.: 716,096

[22] Filed: Mar. 26, 1985

[51] Int. Cl.[4] .............................................. G03F 7/02
[52] U.S. Cl. ................................... 430/281; 430/322; 430/327; 430/394; 164/6; 264/220
[58] Field of Search ............... 430/281, 322, 394, 327, 430/328, 306; 264/220, 225, 226, 227; 164/6, 15, 16, 45

[56] References Cited

U.S. PATENT DOCUMENTS

| | | | |
|---|---|---|---|
| 2,244,187 | 6/1941 | Cochran | 95/5.6 |
| 3,249,436 | 5/1966 | Halpern | 430/494 |
| 3,277,541 | 10/1966 | Wilton et al. | 22/195 |
| 4,329,385 | 5/1982 | Banks et al. | 428/141 |

FOREIGN PATENT DOCUMENTS

| | | | |
|---|---|---|---|
| 268908 | 12/1963 | Australia | 430/306 |
| 2361632 | 12/1972 | Fed. Rep. of Germany . | |
| 4018225 | 6/1974 | Japan . | |
| 1304835 | 1/1973 | United Kingdom | 430/327 |

OTHER PUBLICATIONS

Polish Technical Review, 144-143, Nos. 1-3, pp. 38-40, 1982, Technology of Manufacturing Photo Relief Form.

Primary Examiner—John E. Kittle
Assistant Examiner—Patrick J. Ryan

[57] ABSTRACT

Process for photofabricating master relief patterns from photohardenable layers, e.g., 0.01 to 0.5 inch (0.25 to 12.7 mm in thickness) which comprises: (1) exposing the layer through the back surface to first imagewise modulated actinic radiation for time to render layer insoluble to first preselected depth which when measured from back surface to less than layer thickness, (2) exposing overall to actinic radiation through back to render layer insoluble to second preselected depth which when measured from back surface is less than first preselected depth. (3) exposing imagewise through front surface to actinic radiation for a time sufficient to render exposed areas of layer insoluble to depth extending from front surface to at least second preselected depth, and (4) solvent removing soluble areas of layer.

The master relief pattern is useful in making casting molds.

7 Claims, 9 Drawing Figures

MULTILEVEL IMAGING OF PHOTOPOLYMER RELIEF LAYER FOR THE PREPARATION OF CASTING MOLDS

DESCRIPTION

1. Technical Field

This invention relates to a process for fabricating male patterns used to make casting molds. More particularly, this invention relates to a process for making male patterns used to make casting molds by photofabrication.

2. Background Art

In the fabrication of decorative or commemorative plaques and the like, a female mold is usually prepared into which bronze or other metal is poured to produce a plaque having a raised inscription and/or design. Commemorative or decorative signs and plaques produced by cast metal, especially bronze, tend to have a rough and generally unappealing surface texture. While the top surface of the raised portions may be easily polished, the recessed background areas cannot be polished unless one goes to great expense to grind off the surface of the background areas using specialized equipment. It has been, therefore, common practice in the industry, to prepare a mold which reproduces a textured surface as background, such surface usually being a likeness of a leather pattern.

To prepare a mold, one must first make a three-dimensional male pattern which is basically a duplicate of the finished product. Typically, a leather-textured sheet is first attached to a wooden support to provide the needed background texture. Then any decorative patterns are glued over the textured surface or in place of sections of the textured surface. Decorative patterns involving intricate lace-like work are also very hard to reproduce in the mold and are usually first hand-carved or etched and then attached to the remaining art work used in the making of the mold. Finally, the lettering or other pattern is glued over the textured surface in the form of a three-dimensional carving. Once a satisfactory master relief pattern has been assembled, a mixture of wax and sand as is known to those skilled in the art is poured over the pattern to form a female mold of the pattern of the original art work. The master pattern is later removed and metal, e.g., bronze, silver, copper, etc. cast in the mold to replicate the master pattern.

As is readily understood, accurate reproduction of the original art work in the making of the male pattern is both difficult and expensive. It is therefore desirable to develop a process where artwork of intricate relief patterns can be accurately reproduced at low cost by a quick, relatively fast procedure.

BRIEF DESCRIPTION OF THE DRAWING

In the accompanying drawing forming a material part of this disclosure.

DISCLOSURE OF THE INVENTION

Figure 1:
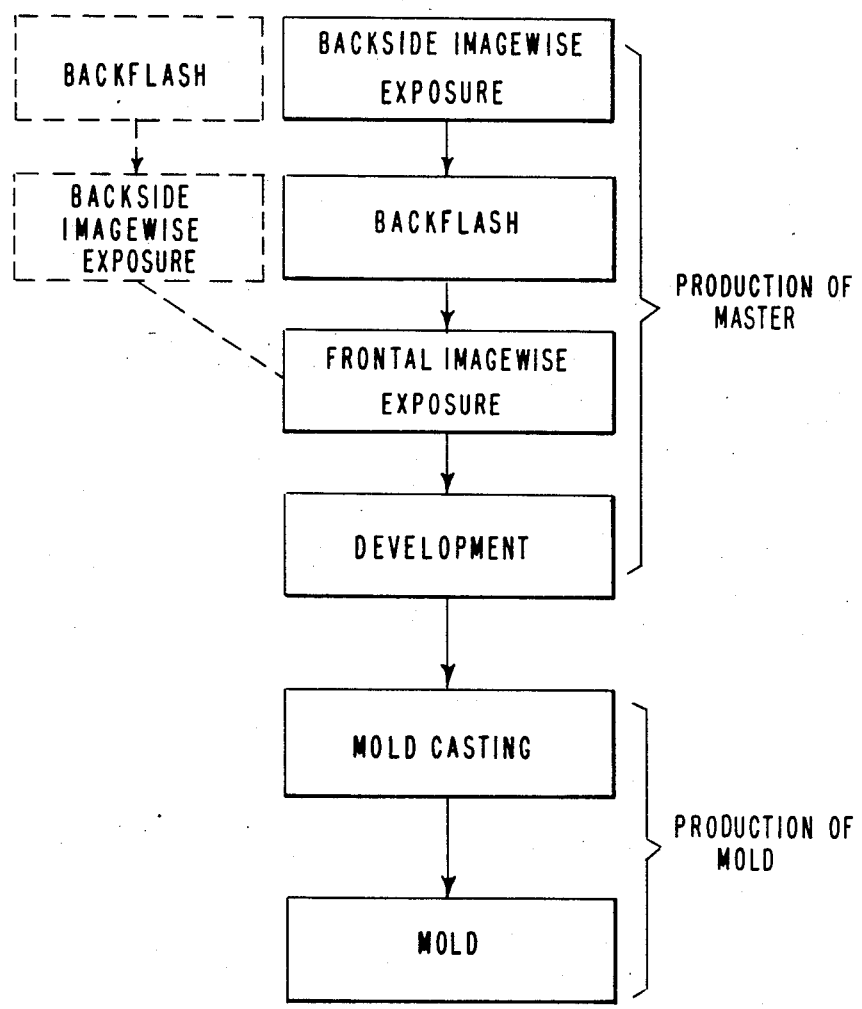
FIG. 1 is a block diagram of the steps required to prepare a master relief pattern designated "Master" in accordance with the invention and a mold from the master.

In accordance with this invention there is provided a process for photofabricating master relief patterns for the production of casting molds using a photohardenable, solvent soluble layer having a front and a back surface and a thickness in the range of 0.010 to 0.5 inch (0.25 to 12.7 mm), comprising the steps of:

(1) exposing the layer through the back surface to a first imagewise modulated actinic radiation for a predetermined duration selected to penetrate the layer and render it imagewise insoluble to a first preselected depth which measured from the back surface is less than the total thickness of the photohardenable layer, (2) exposing the layer a second time through the back surface to unmodulated actinic radiation for a time sufficient to render insoluble the photohardenable layer to a second preselected depth which measured from the back surface is less than the first preselected depth, (3) exposing the layer through the front surface to a second imagewise modulated actinic radiation, for a time sufficient to render insoluble the photohardenable layer to a depth extending from the front surface to at least said second preselected depth, and (4) subjecting the layer to the action of a solvent to remove any portions of the layer not rendered solvent insoluble in steps (1) through (3).

As used herein the word "solvent" means any fluid capable of dissolving unhardened photohardenable material, including organic solvents, aqueous solutions, or mixtures thereof.

DETAILED DESCRIPTION OF THE INVENTION

In the photofabricating of master relief patterns hereinafter designated "master" for the subsequent production of casting molds there is utilized a single layer of a photohardenable composition comprising a polymer of a conjugated diolefin hydrocarbon, a nongaseous, ethylenically unsaturated compound, an organic, radiation-sensitive, free-radical generating photoinitiator or system as well as other additives discussed below. The compositions may be used in layer form or the layer may be adhered to flexible supports, or a temporary support may be used. Another configuration may have a cover sheet and polymeric layer on each side of the photosensitive layer. Preferably the support and/or cover sheet are transparent to actinic radiation used to expose the photohardenable layer as described more fully below. The support and cover sheet are generally as thin as possible so that in the event they are present during exposure the scattering of actinic radiation will be kept to a minimum. Non-transparent supports or cover sheets, of course, must be removed prior to exposure to actinic radiation without damaging the photohardenable layer. The preferred support and cover sheet are removed prior to said exposure. Useful supports and cover sheets include plastic films, e.g., polyethylene terephthalate, polyvinyl chloride, polyamide, polyurethane, etc. To aid in removal of the support and cover sheet they are treated with release agents such as silicone or other known release agents.

The process of this invention as described above is illustrated in the block diagram shown in FIG. 1. Generally the first exposure is a backside imagewise exposure folowed by an overall exposure through the backside designated "Backflash" and frontal imagewise exposure through a phototool, e.g., image-bearing transparency or mask which bears the image or design desired. As shown by the broken blocks the order of exposure through the backside can be reversed, i.e., the backflash can occur first followed by a backside imagewise exposure. After the exposure the unhardened areas of the layer are removed by solvent development to form the master. The master is then used in mold casting whereby a mixture of mold-making material, e.g., comprising sand and wax as known to those skilled in the art, is packed over the master to replicate a complementary relief pattern, and, following removal of the master, a female mold results which is suitable for casting of a metal decorative plaque or other article.

Figure 2:
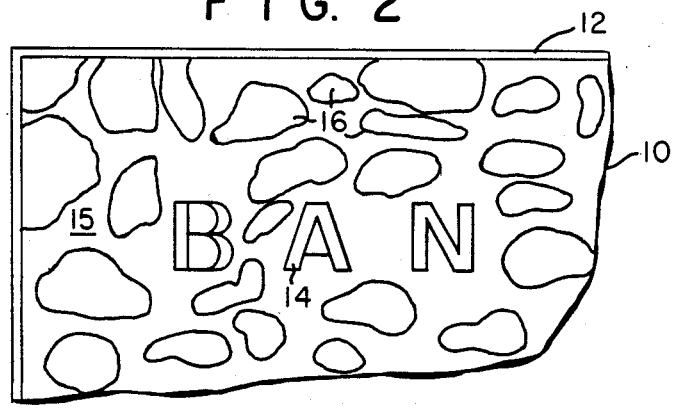
FIG. 2 shows in schematic presentation a portion of a typical decorative plaque prepared in accordance with the invention.

In more detail, FIG. 2 shows a portion of a typical decorative plaque 10 prepared by the process intended for use in a banking establishment. The plaque typically prepared from bronze comprises a background portion 15 containing a decorative leather-like textured pattern 16. The plaque may be surrounded by a raised border 12. The plaque will further contain raised letters 14 and/or a decorative design not shown. In order to produce such a plaque, molten bronze or other known casting metals, e.g., silver, aluminum, gold, platinum, copper, etc. is cast into a mold containing a complementary recessed pattern of the raised pattern found in the plaque.

The photohardenable layer useful in the practice of the invention is formed from a composition, a polymer of a conjugated diolefin hydrocarbon, an ethylenically unsaturated compound and an initiator activatable by actinic radiation. The photohardenable layer is developable in its unexposed state in aqueous, semiaqueous basic, or organic solvent solutions depending on the particular polymeric binder or binders present therein. The layers are in a thickness range of about 0.010 to 0.500 inch (about 0.25 to 12.7 mm) or more.

Suitable binders include natural or synthetic polymers of conjugated diolefin hydrocarbons. Examples of the binders include: 1,2-polybutadiene, 1,4-polybutadiene, butadiene/acrylonitrile, butadiene/styrene, block copolymers of the A-B-A type, e.g., styrene-butadienestyrene block copolymer, styrene-isoprene-styrene block copolymer, etc., and copolymers of the binders. The block copolymers may be of the linear, radial, or sequential type. Also useful are block copolymers of the A-B-C type which have A and B blocks and a C block of a random copolymer of the A and B components or other components. Such copolymers are disclosed in Heinz et al., U.S. Pat. No. 4,328,188, which is incorporated herein by reference. The preferred binders are the styrene-isoprene-styrene or styrene-butadiene-styrene block copolymers and butadiene/acrylonitrile copolymers optionally having a carboxyl content.

Useful linear block copolymers of this invention have at least one unit of the generaly formula, A-B-A, wherein each A is an independently selected nonelastomeric polymer block having a number average molecular weight ($\overline{Mn}$) of 2000–100,000 and a glass transition temperature above 25° C. and B is an elastomeric polymer block having an average molecular weight between about 25,000 and 1,000,000 and a glass transition temperature below about 10° C. The nonelastomeric blocks, A, having between them an elastomeric block, B, together comprise the unit A-B-A which represents the copolymers uniquely suitable for use in combination with the photopolymerizable components in the compositions of the invention. This unit may comprise the entire general formula of the copolymer; it may be appended to another polymer chain; or it may be repeating. It is, of course, possible to vary the precise nature of the unit within the scope of the invention, e.g., by using two different nonelastomeric terminal blocks, A, or by creating block or graft polymeric substitutions in blocks A and B. Preferably, the elastomeric mid-section blocks, B, are polymers of aliphatic conjugated diolefins while the nonelastomeric blocks, A, are those formed by polymerizing alkenyl aromatic hydrocarbons, preferably vinyl substituted aromatic hydrocarbons, and still more preferably vinyl monocyclic aromatic hydrocarbons. The block copolymers are disclosed in Holden et al. U.S. Pat. No. 3,265,765 and couterpart British Pat. No. 1,000,090, incorporated herein by reference. Particularly preferred species of the subject copolymers comprise block copolymers of polystyrene terminal groups connected by a mid-section of polyisoprene or polybutadiene, e.g., polystyrene-polyisoprene-polystyrene or polystyrene-polybutadiene-polystyrene, the polydiene block being 70 to 90% by weight of the block copolymer. Other typical block copolymers useful in this invention are polystyrene-polybutadienepolystyrene and polystyrene-polyisoprenepolystyrene block copolymers which have been hydrogenated according to the teachings of U.S. Pat. Nos. 3,431,323 to Jones and 3,333,024 to Hefele et al. The hydrogenated block copolymers have the additional advantage of improved thermal and oxidative resistance. However, some residual unsaturation in hydrogenated block copolymers is desirable, since only very small concentrations of monomer are then needed in the photosensitive compositions to reduce solvent solubility upon exposure to actinic radiation. Still other typical block copolymers useful in this invention are those wherein the terminal blocks are polyalkyl styrenes, e.g., poly($\alpha$-methyl styrene)-polyisoprene-poly ($\alpha$-methyl styrene), and those composed of a plurality of polymer blocks, e.g., polyisoprene-polystyrene-polybutadiene-polystyrene-polyisoprene.

The number average molecular weights for the block copolymers can be determined by membrane osmometry utilzing a gel cellophane 600 W membrane manufactured by Arro Laboratories, In., Joliet, Ill. and toluene as the solvent at 29° C. The $\overline{Mn}$ for the nonelastomeric polymer blocks and elastomeric polymer blocks are preferably determined as follows:

A. The molecular weight of the first block (polystyrene) can be measured by gel permeation chromatography (GPC) of a terminated sample removed immediately after the polymerization. The chromatograph is calibrated using commercially available polystyrene molecular weight standards.

B. The $\overline{Mn}$ of the second block (polyisoprene or polybutadiene) can be determined in the following manner:

(1) measuring by suitably calibrated GPC the $\overline{Mn}$ of a sample of polystyrene-polyisoprene (or polybutadiene) diblock polymer terminated and removed immediately after its polymerization, and (2) subtracting from this value the $\overline{M}n$ of the first block as determined in (A) above.

C. The $\overline{M}n$ of the third block (polystyrene) can be determined in the same general manner:
(1) measuring by suitably calibrated GPC the $\overline{M}n$ of the sample of polystyrene-polyisoprene (or polybutadiene)-polystyrene triblock polymer, and
(2) subtracting from this value the $\overline{M}n$ of the diblock polymer obtained in (B) above. The block copolymers are manufactured by Shell Chemical Company and sold under the trademark "Kraton ®".

Usefule butadiene/acrylonitrile copolymers are high molecular weight butadiene/acrylonitrile copolymers having a number average molecular weight ($\overline{M}n$) in the range of about 20,000 to about 75,000, preferably in the range of about 24,000 to about 50,000. The $\overline{M}n$ for the copolymers described herein can be determined by gel permeation chromatography employing a polybutadiene standard. The acrylonitrile content of the polymers varies from about 10 to about 50% by weight, preferably from about 15 to about 40%. Optionally, the copolymer also has a carboxyl content of 0 to about 15% by weight. When the copolymer contains carboxyl groups, the carboxyl content is preferably in the range of about 1 to about 15%, most preferably in the range of about 2 to 10% by weight. The copolymer is present in an amount of about 55 to 90% by weight, based on the total weight of the composition, and preferably about 60 to about 75% by weight. At least about 55% by weight of the copolymer is necessary to give adequate flexibility and physical integrity to photosensitive elements, particularly for flexographic plates.

Carboxyl groups may be incorporated into the high molecular weight copolymer by addition to the polymerizatio process of a carboxyl containing monomer, e.g., acrylic or methacrylic acid, or a monomer which is convertible to a carboxyl containing group, e.g., maleic anhydride or methyl methacrylate. Such polymers are available commercially from several sources, e.g., from the B. F. Goodrich Chemical Company under the trade name Hycar ®.

Another essential ingredient of the photosensitive compositions of this invention is a nongaseous, ethylenically unsaturated compound, preferably containing at least one terminal ethylenic group. These compounds generally are capable of forming a high polymer by free-radical initiated chain-propagating addition polymerization and be compatible with the high molecular weight polymers described above. Ethylenically unsaturated compounds which are compatible with the A-B-A type block copolymers set forth above are disclosed in British Pat. No. 1,366,769 incorporated herein by reference. Many of these monomers are specifically disclosed below. One class of suitable ethylenically unsaturated compounds includes unsaturated esters of alcohols, especially such esters of α-methylene carboxylic acids and substitued α-methylene carboxylic acids, more especially such esters of alkylene polyols and polyalkylene polyols, and most especially alkylene polyol di- and tri-acrylates and polyalkylene polyol di- and tri-acrylates prepared from alkylene polyols of 2–15 carbon atoms or polyalkylene ether polyols or glycols of 1–10 ether linkages.

The following specific compounds are further illustrative of this class: ethylene glycol diacrylate, diethylene glycol diacrylate, glycerol diacrylate, glycerol triacrylate, trimethylolpropane triacrylate, ethylene glycol dimethacrylate, 1,3-propanediol dimethacrylate, 1,2,4-butanetriol trimethacrylate, 1,4-cyclohexanediol diacrylate, 1,4-benzenediol dimethacrylate, 1,2-benzenedimethanol diacrylate, pentaerythritol triacrylate, pentaerythritol tetra- methacrylate, 1,3-propanediol diacrylate, 1,3-pentane- diol dimethacrylate, p-α,α-dimethylbenzylphenyl acrylate, t-butyl acrylate, N,N-diethylaminoethyl acrylate, diethylaminoethyl methacrylate, 1,4-butane-diol diacrylate, hexamethylene glycol diacrylate, decamethylene glycol diacrylate, 2,2-diamethylolpropane diacrylate, tripropylene glycol diacrylate, 2,2-di(p-hydroxy-phenyl)propane diacrylate, 2,2-di(p-hydroxy- phenyl) propane dimethacrylate, polyoxyethyl-2,2-di(p-hydroxyphenyl)propane tiacrylate (molecular weight of 462), 1,4-butanediol dimethacrylate, hexamethylene glycol dimethacrylate, 2,2,4-trimethyl-1,3-pentanediol dimethacrylate, 1-phenylethylene-1,2-dimethacrylate, trimethylolpropane trimethacrylate, triethylene glycol diacrylate, ethylene glycol acrylate phthalate, polyoxyethyltrimethylolpropane triacrylate, diacrylate and dimethacrylate esters of diepoxy polyethers derived from aromatic polyhydroxy compounds such as bisphenols, novolaks and similar compounds such as those described by Crary in U.S. Pat. No. 3,661,576, which is incorporated by reference, the bisacrylates and methacrylates of polyethylene glycols of molecular weight 200–500, etc.

Another class of suitable ethylenically unsaturated compounds includes the compounds disclosed by Martin and Barney in U.S. Pat. No. 2,927,022 which is incorporated herein by reference, e.g., those having a plurality of addition polymerizable ethylenic linkages, particularly when present as terminal linkages, and especially those wherein at least one and preferably most of such linkages are conjugated with a double bonded carbon, inlcuding carbon double bonded to carbon and to heteroatoms such as nitrogen, oxygen and sulfur. Preferred are such materials wherein the ethylenically unsaturated groups, especially the vinylidene groups, are conjugated with ester or amide structures. Specific examples of such compounds include unsaturated amides, particularly those of α-methylene carboxylic acids, especially with α-omega-diamines and oxygen-interrupted omega-diamines, such as methylene bis-acrylamide, methylene bis-methacrylamide, ethylene bis-methacrylamide, 1,6-hexamethylene bis-acrylamide, diethylene triamine trismethacrylamide, bis(γ-methacrylamidopropoxy)ethane, β-methacrylamidoethyl methacrylate, N-(β-hydroxyethyl)-β-(methacrylamido)ethyl acrylate, and N,N-bis(β-methacryloxyethyl) acrylamide; vinyl esters such a divinyl succinate, divinyl adipate, divinyl phthalate, divinyl terephthalate, divinyl benzene-1,3-disulfonate, and divinyl butane-1,4-disulfonate; diallyl fumarate; etc.

Additional ethylenically unsaturated compounds which may be used include styrene and derivatives thereof: 1,4-diisopropenylvenzene, 1,3,5-trisopropenylbenzene; itaconic anhydride adducts with hydroxyethyl acrylate (1:1), itaconic anhydride adducts with liquid butadiene/acrylonitrile polymers containing terminal amino groups, and itaconic anhydride adducts with the diacrylate and dimethacrylate esters of diepoxy polyethers described in Crary U.S. Pat. No. 3,661,576; polybutadiene and butadiene/acrylonitrile copolymers containing terminal and pendant vinyl groups; and unsaturated aldehydes, such a sorbaldehyde (2,4-hexadienal).

Ethylenically unsaturated compounds which are water soluble or contain carboxyl or other alkalireactive groups are especially suitable when aqueous basic-developable systems are involved. In addition, the polymerizable, ethylenically unsaturated polymers U.S. Pat. Nos. 3,043,805 of Burg; 2,929,710 of Martin; and similar materials may be used alone or mixed with other materials. Acrylic and methacrylic esters of adducts of ethylene oxide and polyhydroxy compounds such as those described by Cohen and Schoenthaler in U.S. Pat. No. 3,418,295, and Celeste, U.S. Pat. No. 3,448,089, may also be used. All of these patents are incorporated herein by reference.

The ratio of the weight of block copolymer used to the weight of addition polymerizable ethylenically unsaturated compound use is 99:1 to about 1:1.

The amount of unsaturated compound present in a photosensitive composition containing a butadiene/acrylonitrile copolymer should be in the range of about 2 to about 40% by weight, based on the total weight of composition. The specific amount for optimum results will vary depending on the particular polymers used. Preferably the amount of unsaturated compound is in the range of about 5 to about 25%.

The ethylenically unsaturated compound preferably has a boiling point at normal pressure of over about 100° C. The most preferred ethylenically unsaturated compounds are triethylene glycol diacrylate, triethylene glycol dimethacrylate, hexamethylene glycol dimethacrylate and hexamethylene glycol diacrylate.

The photosensitive compositions of this invention substantially do not scatter actinic radiation when the form of thin layers, as described above. In order to secure a substantially transparent mixture, i.e., a non-radiation-scattering mixutre, the polymer binder components should be compatible with, and preferably soluble in, the ethylenically unsaturated compound in the proportions used.

By "compatible" is meant the ability of two or more constituents to remain dispersed in one another without causing any significant amount of scattering of actinic radiation. Compatibility is often limited by the relative proportions of the constituents, and incompatibility is evidenced by formation of haze in the photosensitive composition. Some slight haze can be tolerated from such compositions before or during exposure inthe preparation of printing reliefs, but when fine detail is desired, haze should be completely avoided. The amount of ethylenically unsaturated compound, or any other consitutent, used is therefor elimited to those concentrations which do not produce undesired light scatter or haze.

The photosensitve compositions also contain an organic, radiation-sensitive, free-radical generating system. Practically any organic, radiation-sensitive, free-radical generating system which initiates polymerization of the unsaturated compound and does not excessively terminate the polymerization can be used in the photosensitive compositions of this invention. The term "organic" is used here and in the claims to designate compounds which contain carbon, and one or more of oxygen, hydrogen, nitrogen, sulfur and halogen, but no metal. Because process transparencies transmit heat originating from conventional sources of actinic radiation, and since the photosensitive compositions are usually prepared under conditions resulting in elevated temperatures, the preferred free-radical generating compounds are inactive thermally below 85° C. and more preferably below 185° C. They should be dispersible in the composition to the extent necessary for initiating the desired polymerization of cross-linking under the influence of the amount of radiation absorbed in relatively short term exposurees. These initiators are useful inamounts from about 0.001 to about 10% by weight, and preferably from about 0.1 to about 5% based ont he total weight of the solvent-free photosensitive composition.

The free-radical generating system absorbs radiation within the range of about 2000 to about 8000 Å and has at least one component that has an active radiation absorption band with molar extinction coefficient of at least about 50 within the range of about 2500 to about 8000 Å, and preferably about 2500 to about 5000 Å. The term "active radiation absorption band" means a band of radiation which is active to produce the free radicals necessary to initiate polymerization or crosslinking of the unsaturated material.

The free-radical generating system can comprise one or more compounds which directly furnish free radicals when activated by radiation. It can also comprise a plurality of compounds, one of which yields the free radicals after having been caused to do so by a sensitizer which is activated by the radiation.

A large number of such free-radical generating compounds can be utilized in the practice of the invention and include aromatic ketones such as benzophenone, Michler's ketone [4,4'-bis(dimethylamino)benzophenone], 4,4'-bis(diethylamino)benzophenone, 4-acryloxy-4'-dimethylaminobenzophenone, 4-acryloxy-4'-diethylaminobenzophenone, 4-methoxy-4'-dimethylaminobenzophenone, 2-phenyl-2,2-dimethoxyacetophenone(2,2-dimethoxy-1,2-diphenyl ethanone), 2-ethylanthraquinone, phenanthraquinone, 2-t-butylanthraquinone, 1,2-benzanthraquinone, 2,3-benzathraquinone, 2,3-dichloronaphthoquinone, benzil dimethyl acetal, and other aromatic ketones; benzoin, benzoin ethers such as benzoin methyl ether, benzoin ethyl ether, benzoin isobutyl ether, and benzoin phenyl ether, methylbenzoin, ethylbenzoin and other benzoins; and 2,4,5-triarylimidazolyl dimers such as 2-(o-chloro-phenyl)-4,5-diphenylimidazolyl dimer, 2-(o-chloro- phenyl-4,5-di(m-methoxyphenyl)imidazolyl dimer, 2-(o-fluorophenyl)-4,5-diphenylimidazolyl dimer, 2-(o-methoxyphenyl)-4,5-diphenylimidazolyl dimer, 2-(p-methoxyphenyl)-4,5-diphenylimidazolyl dimer, 2,4-di(p-methoxyphenyl)-5-phenylimidazolyl dimer, 2-(2,4-dimethoxyphenyl)-4,5-diphenylimidazolyl dimer, 2-(p-methlmercaptophenyl)-4,5-diphenylimidazolyl dimer, etc., as disclosed in U.S. Pat. Nos. 3,479,185 and 3,784,557 and in British Pat. Nos. 997,396 and 1,047,569. These patents are incorporated herein by reference.

The imidazolyl dimers can be used with a free-radical producing electron donor such as 2-mercaptobenzoxazole, Leuco Crystal Violet or tri(4-diethylamino-2-methylphenyl)methane. Such sensitizers as Michler's ketone may be added. Various energy transfer dyes such as Rose Bengal and Eosin Y can also be used. Additional examples of suitable initiators are disclosed by Plambeck in U.S. Pat. No. 2,760,863 which is incorporated herein by reference.

The photosensitive compositions may also contain a small amount of thermal addition polymerization inhibitor, e.g., 0.001% to 2.0%, based on the weight of the total solvent-free photosensitive composition. Suitable inhibitors include hydroquinone and alkyl and aryl-substituted hydroquinones, 2,6-di-tert-butyl-4-methylphenol, p-methoxyphenol, ter-butylpyrocatechol, pyrogallol, β-naphthol, 2,6-di-tert-butyl-p-cresol, phenothiazine, pyridine, nitrobenzene, dinitrobenzene and the nitroso dimer inhibitor systems described in U.S. Pat. No. 4,168,982 which is incorporated herein by reference. Other useful inhibitors include p-toluquinone, chloranil and thiazine dyes, e.g., Thionine Blue G (CI 51025), Methylene Blue B (CI 52015) and Toluidine Blue (CI 52040). Such compositions can be photopolymerized or photocrosslinked without removal of the inhibitor. The preferred inhibitors are 2,6-di-tert-butyl-4-methylphenol and p-methoxyphenol.

Figure 3:
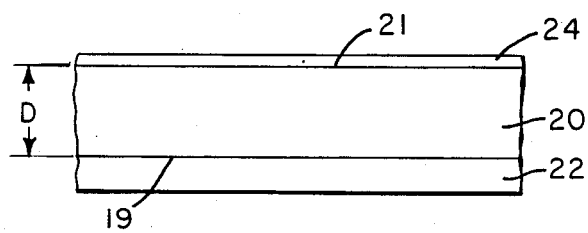
FIG. 3 is a schematic presentation of a side view of a photohardenable element useful in practicing this invention.

Typically such a photohardenable layer 20 shown in FIG. 3 comprises a supporting base 22 usually out of polyethylene terephthalate, preferably having a release coating, e.g., silicon, thereon. Over the photohardenable layer 20 is a removable cover sheet 24. Typical thickness of the photohardenable layer 20 is D=0.112 inch (2.85 mm). The layer has a front side 21 and a backside 19. It is preferably that a photohardenable layer used in this process has not had any prior exposure to actinic radiation from either the front or the backside. However, layers having rec3eived a preexposure to unmodulated radiation through the backside to form a relatively thin hardened lower portion of the layer may also be used.

Figure 4:
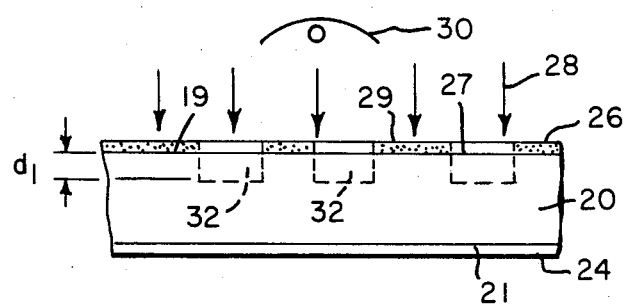
FIGS. 4 through 6 illustrate schematically the effect of three exposure steps used to prepare a master for the preparation of a casting mold in accordance with this invention.

The first step of the process involved the backside imagewise exposure of the photohardenable layer 20. This operation is best understood with reference to FIG. 4. The layer is placed in an exposure unit, generally equipped with a vacuum frame, backside up, preferably with support 22 removed. The expsoure unit has been omitted from the figures for simplicity. A source of actinic radiation 30 at a given distance from the exposure unit and the photohardenable layer is depicted. Actinic radiation 28 from the source is directed towards the layer. In the preferred embodiment it is desirable that the actinic radiation be collimated; usually a point source of light such as a NAPPS exposure unit may be used. This is desirable to prevent sidewise spread of the light and loss of resolution during the exposure process. Other known exposure sources are also useful; those rich in ultraviolet radiation are preferred. A light modulator which may consist of a transparency 26 having imagewise transparetn 27 and opaque 29 areas, preferably having a matte surface, is placed over layer 20. The modulator 26 allows actinic radiation 28 to expose the photosensitive layer 20 in a pattern of a desired background, e.g., as a reproduction of textured leather.

The exposure time and the intensity of the actinic radiation 28 is calculated such as to render insoluble the portions 32 of the photohardenable layer 20 that are exposed to the radiation, to a depth $d_1$ preselected to correspond to the raised portions of the background level of the finished master. Typically $d_1$ is 0.040 to 0.050 inch (1.016 to 1.27 mm).

Figure 5:
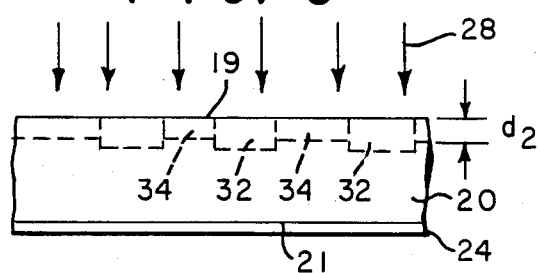
Figure 6:
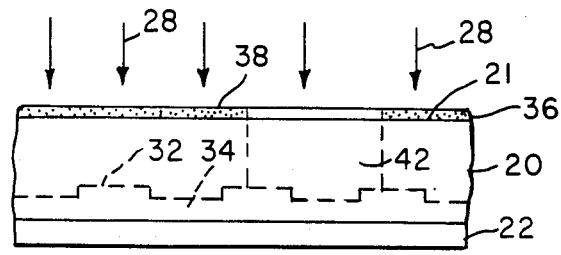

Following the first exposure, the modulator 26 is removed and the photohardenable layer is subjected to a second non-modulated back exposure as shown in FIG. 5. This exposure known as backflash is calculated to render uniformly insoluble a layer 34 extending a second predetermined depth $d_2$ as measured from the backside 19 of the photosensitive layer 20. Typically $d_2$ is 0.010 to 0.020 inch (0.254 to 0.5 mm). As shown in FIG. 5 this depth as measured from surface 19 is less than the depth $d_1$ to which the photohardenable layer has been rendered insoluble in an imagewise pattern by the first exposure. This determines how deep will be the relief of the background pattern. Typically this relief is about 0.030 inch (0.762 mm).

When layers that have received a non-image exposure through the back are used, (usually, but not necessarily during manufacturing) the backflash exposure step is not needed. However, care must be used in calculating the first exposure to provide a depth $d_1$ exceeding the depth $d_2$ of insoluble layer produced by this unmodulated backflash exposure.

The layer with cover sheet 24 is now taken out of the expsoure station and the supporting base 22 replaced over the back surface 19 of the photohardenable layer 20. The plate is next placed back on the expsoure station with frontside 21 now facing the actinic radiation source. The cover layer 24 is removed and a second modulator 36 which contains the art work representing the raised portions of the final plaque or atcile is placed over surface of front side 21. Again this modulator contains transparent 40 and opaque 38 areas corresponding to the art work. Again this modulator can be a litho type transparency preferably having a matte surface. The photohardenable layer is now exposed to a second imagewise exposure for a preselected time sufficient to render it insoluble to a depth at least as great as $D-d_2$ as measured from the top surface of front side 21, i.e., the exposed areas will become insoluble through the entire thickness of the photohardenable layer. Hardened area 42 shows a depth of at least $D-d_2$.

Figure 7:
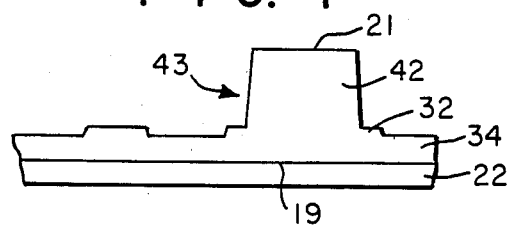
FIG. 7 is a schematic illustration of a master prepared by the inention.

Following this exposure, the layer is placed in a standard developing apparatus where under the action of solvent the soluble portions of the plate are washed away leaving a relief image on a base layer which replicates both the background pattern and the relief art work. The master 43 shown in FIG. 7 is prepared after liquid development which may be used to produce a casting mold.

Figure 8:
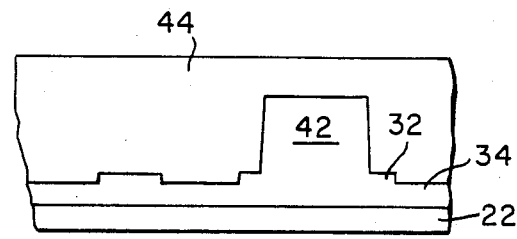
FIGS. 8 and 9 show schematically the use of the master for the preparation of a casting mold.
Figure 9:
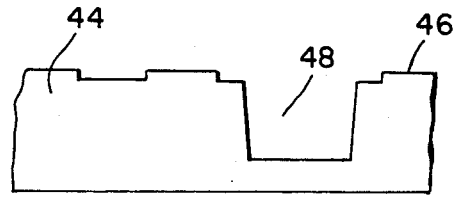

The making of a mold proceeds along the traditional casting mold making operations. As shown in FIG. 8, a mixture of sand and wax of a composition known to those skilled in the art 44 is poured and pressed all around the relief portions of the master. The master is then removed leaving behind a mold 46 having complementary indentations 48 corresponding to the relief 42 as shown in FIG. 9. Mold 46 may now be used for the casting of the metal to produce the plaque.

It is within the contemplation of the present invention to employ a scanning light source, such as a scanning laser beam and combine such a source with an electro-optical or other similar modulator. While best results have been obtained using the process step sequence discussed, the order of the three exposure steps may be altered provided that the various exposures are precalculated to render insoluble the photohardenable layer to depths as disclosed above.

EXAMPLE

A flexographic printing plate commercially available under the trade name Cyrel ® 112SC (E. I. du Pont de Nemours and Company, Wilmington, Del.) was first exposed to modulated actinic radiation in a commercial Cyrel ® 3040 exposure unit comprising a bank of 24 U.V. fluorescent blank light tube lamps made by Sylvania Co., type 7R-48T-12/B2/VHO/180. Prior to this exposure the polyethylene terephthalate film support was removed from the flexographic printing plate. The film was palced in the exposure unit with the uncovered side facing the exposure source. A matte surface lithotype negative such as the Cronar ® Polyester Photographic Film (E. I. du Pont de Nemours and Company, Wilmington, Del.) containing the pattern desired to be reproduced as background for a given plaque is placed over the plate. Vacuum was applied to provide good contact between the negative and the plate and the plate was exposed to actinic radiation for 12 seconds. Following this first exposure, the Cronar ® Polyester Photographic Film negative was removed and using the same exposure equipment the plate was exposed to actinic radiation for an additional 5 seconds. the plate was then removed from the exposure equipment and the polyethylene terephthalate film support readhered to the exposes surface of the plate. The cover sheet of the plate was next removed and the plate placed again in the exposure equipment stripped side up. A second litho negative of the same type as before bearing an image of the raised inscription of the plaque was next placed on the plate and the plate was placed under vacuum and exposed as before to actinic radiation for 4.5 minutes. The exposed plate was subsequently placed in a processing machine for this type of flexographic printing plate where using Cyrel ® Flex Solvent (E. I. du Pont de Nemours and Company, Wilmington, Del.) the unexposed, unhardened areas of the plate were washed off, in about 13 minutes, leaving behind a three dimensional pattern. A conventional mixture of sand and wax was now packed over this pattern to form upon removal of the plate a female mold into which bronze was cast to form a plaque which faithfully reproduced both the background pattern as well as the raised lettering. The plaque was finished with buffing of the raised letters and staining of the background as is customary in this trade.

What is claimed is:

1. A process for photofabricating master relief patterns for the production of casting molds using a photo hardenable, solvent soluble layer having a front and a back surface and a thickness D in the range of 0.010 to 0.5 inch (0.25 to 12.7 mm), comprising the steps of:
    (1) exposing the layer through the back surface to a first imagewise modulated actinic radiation for a predetermined duration selected to penetrate the layer and render it imagewise insoluble to a first maximum preselected depth $d_1$ which measured from the back surface is less than the total thickness of the photohardenable layer,
    (2) exposing the layer a second time through the back surface to unmodulated actinic radiation for a time sufficient to render insoluble the photohardenable layer to a second preselected depth $d_2$ less than the first preselected depth by an amount equal to the desired maximum relief of a background pattern,
    (3) exposing the layer through the front surface to a second imagewise modulated actinic radiation, for a time sufficient to render insoluble the photohardenable layer to a depth at least as great ad $D-d_2$ as measured from the front surface, and
    (4) subjecting the layer to the action of a solvent to remove any rotions of the layer, not rendered solvent insoluble in steps (1) through (3).

2. A process according to claim 1 wherein exposure steps (1) and (2) are reversed.

3. A process according to claim 1 wherein the photohardenable layer is prepared from a composition comprising a polymer of a conjugated diolefin hydrocarbon, a nongaseous ethylenically unsaturated compound and an organic, radiation-sensitive, free radical generating photoinitiator or photoinitiator system.

4. A process according to claim 3 wherein the conjugated diolefin hydrocarbon polymer is a polymer selected from butadiene/acrylonitrile, butadiene/acrylonitrile/acrylic acid, butadiene/styrene, styrene-butadiene-styrene block copolymer and styrene-isoprene-styrene block copolymer.

5. A process according to claim 1 wherein the solvent used in step (4) is taken from the group consisting of organic solvent, aqueous solution and mixtures thereof.

6. A process according to claim 1 wherein the solvent used in step (4) is water.

7. A process for production of a casting mold using a master relief pattern photofabricated from a photohardenable, solvent soluble layer having a front and back surface and a thickness D in the range of 0.010 to 0.5 inch (0.25 to 12.7 mm), comprising the steps of:
    (1) exposing the layer through the back surface to a first imagewise modulated actinic radiation for a predetermined duration selected to penetrate the layer and render it imagewise insoluble to a first maximum preselected depth $d_1$ which measured from the back surface is less than the total thickness of the photohardenable layer,
    (2) exposing the layer a second time through the back surface to unmodulated actinic radiation for a time sufficient to render insoluble the photohardenable layer to a second preselected depth $d_2$ which measured from the back surface is less than the first preselected depth by an amount equal to the desired maximum relief of a background pattern,
    (3) exposing the layer through the front surface to a second imagewise modulated actinic radiation, for a time sufficient to render insoluble the photohardenable layer to a depth at least as great as $D-d_2$ as measured from the front surface,
    (4) subjecting the layer to the action of a solvent to remove any portions of the layer not rendered solvent insoluble in steps (1) through (3), and
    (5) applying a suitable mold-making composition over the master relief pattern produced as described in steps (1) through (4) to form a casting mold.

* * * * *

UNITED STATES PATENT AND TRADEMARK OFFICE
CERTIFICATE OF CORRECTION

PATENT NO.  : 4,668,607
DATED       : May 26, 1987
INVENTOR(S) : Michael S. Wojcik It is certified that error appears in the above-identified patent and that said Letters Patent is hereby corrected as shown below:

Column 11, line 53, the word "ad" should be --as--.

Column 12, line 2, the word "rotions" should be --portions--.

Signed and Sealed this

Twenty-seventh Day of October, 1987

*Attest:*

DONALD J. QUIGG

*Attesting Officer*   *Commissioner of Patents and Trademarks*